United States Patent
Li et al.

(10) Patent No.: US 10,031,393 B2
(45) Date of Patent: Jul. 24, 2018

(54) ARRAY SUBSTRATE, DISPLAY DEVICE AND METHOD FOR MANUFACTURING THE SAME

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Shaoru Li, Beijing (CN); Heecheol Kim, Beijing (CN)

(73) Assignees: BOE TECHNOLOGY GROUP CO., LTD. (CN); CHONGQING BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/301,972

(22) PCT Filed: Jan. 13, 2016

(86) PCT No.: PCT/CN2016/070741
§ 371 (c)(1),
(2) Date: Oct. 5, 2016

(87) PCT Pub. No.: WO2017/012304
PCT Pub. Date: Jan. 26, 2017

(65) Prior Publication Data
US 2017/0205676 A1    Jul. 20, 2017

(30) Foreign Application Priority Data
Jul. 21, 2015 (CN) .......................... 2015 1 0431650

(51) Int. Cl.
*G02F 1/1362* (2006.01)
*G02F 1/1343* (2006.01)
(Continued)

(52) U.S. Cl.
CPC ...... *G02F 1/136286* (2013.01); *G02F 1/1368* (2013.01); *G02F 1/13439* (2013.01);
(Continued)

(58) Field of Classification Search
CPC ......... H01L 27/15; H01L 31/12; H01L 33/00; H01L 31/153; H01L 31/173; H01L 31/00; G02F 2001/133616
See application file for complete search history.

(56) References Cited

U.S. PATENT DOCUMENTS

2009/0026451 A1    1/2009  Shin et al.
2010/0134744 A1*   6/2010  Lee .................. G02F 1/134363
                                                        349/143
(Continued)

FOREIGN PATENT DOCUMENTS

CN    101750814 A    6/2010
CN    101770125 A    7/2010
(Continued)

OTHER PUBLICATIONS

First Office Action for Chinese Application No. 201510431650.6, dated Aug. 9, 2017, 6 Pages.
(Continued)

*Primary Examiner* — Sonya D McCall Shepard
(74) *Attorney, Agent, or Firm* — Brook Kushman P.C.

(57) ABSTRACT

The disclosure provides an array substrate, a display device and a method for manufacturing the array substrate. The array substrate includes a base substrate, a plurality of gate lines and data lines provided thereon, a first common electrode line with an extending direction that is the same as that of the gate line, and a second common electrode line with an extending direction that is the same as that of the data line. The first common electrode line and the second common electrode line are in different layers. The first common
(Continued)

electrode line and the second common electrode line are connected in a bridged mode.

17 Claims, 6 Drawing Sheets

(51) Int. Cl.
*G02F 1/1368* (2006.01)
*H01L 27/12* (2006.01)

(52) U.S. Cl.
CPC .......... *G02F 1/134309* (2013.01); *G02F 2001/13629* (2013.01); *G02F 2001/134345* (2013.01); *G02F 2001/136295* (2013.01); *G02F 2201/121* (2013.01); *G02F 2201/123* (2013.01); *H01L 27/124* (2013.01)

(56) References Cited

U.S. PATENT DOCUMENTS

| | | | |
|---|---|---|---|
| 2012/0069286 A1* | 3/2012 | Huang | G02F 1/136227 349/147 |
| 2017/0205676 A1 | 7/2017 | Li et al. | |

FOREIGN PATENT DOCUMENTS

| | | |
|---|---|---|
| CN | 102237355 A | 11/2011 |
| CN | 202975548 U | 6/2013 |
| CN | 103926765 A | 7/2014 |
| CN | 104965367 A | 10/2015 |
| KR | 20040013599 A | 2/2004 |

OTHER PUBLICATIONS

International Search Report and Written Opinion for Application No. PCT/CN2016/070741, dated Mar. 24, 2016, 10 Pages.

* cited by examiner

ARRAY SUBSTRATE, DISPLAY DEVICE AND METHOD FOR MANUFACTURING THE SAME

CROSS-REFERENCE TO RELATED APPLICATIONS

This application is the U.S. national phase of PCT Application No. PCT/CN2016/070741 filed on Jan. 13, 2016, which claims priority to Chinese Patent Application No. 201510431650.6 filed on Jul. 21, 2015, the disclosures of which are incorporated in their entirety by reference herein.

TECHNICAL FIELD

The present disclosure relates to the field of liquid crystal display technology, in particular to an array substrate, a display device and a method for manufacturing the same.

BACKGROUND

In recent years, due to advantages such as lightness and thinness, power saving and free of radiation, liquid crystal display devices have replaced conventional cathode-ray tube displays, and have been widely used in numerous electronic devices.

Most of liquid crystal display devices in the related art are provided therein with a great number of lines for emitting light, and mutual influences of the lines may cause voltage fluctuation. As a result, screens of the liquid crystal display devices easily become green. That is, the commonly known Greenish phenomenon occurs. For addressing such a phenomenon, a gate electrode may be driven at one side by means of Gate IC for high-definition products with large sizes. In other words, one side of an array substrate may be provided with a common electrode trace, and a resistance of a common electrode is reduced by the presence of the common electrode trace with a large width, thereby reducing the probability of occurrence of Greenish. However, for full high-definition or ultra high-definition products with large sizes, the Gate IC needs to be provided at two sides of the array substrate for driving. In this way, the entire display device lacks wiring space for the common electrode. The current solution is to provide a voltage compensation circuit for the Gate IC to avoid the occurrence of the Greenish phenomenon, which increases the cost.

SUMMARY

The present disclosure is to solve the problem of signal interference caused by an excessively large resistance of the common electrode line in a display device with a high definition and a large size.

For solving the above technical problem, one embodiment of the present disclosure provides an array substrate, which includes a base substrate, a plurality of gate lines and data lines provided thereon, a first common electrode line and a second common electrode line. The extending direction of the first common electrode line is the same as that of the gate line, and the extending direction of the second common electrode line is the same as that of the data line. The first common electrode line and the second common electrode line are in different layers, and the first common electrode line and the second common electrode line are connected in a bridged mode.

Further, the gate line and the first common electrode line are in the same layer.

Further, the second common electrode line and the data line are in the same layer. The array substrate further includes a gate insulation layer between the gate lines and the data lines. The gate insulation layer is provided with a via hole. The second common electrode line is connected to the first common electrode line in a bridged mode through the via hole in the gate insulation layer, and the via hole in the gate insulation layer is positioned at a region where the first common electrode line overlaps with the second common electrode line.

Further, the array substrate includes sub-pixels in rows and columns, and they are divided into a plurality of pixel groups. Each of the pixel groups is defined by two adjacent sub-pixels in the same row, and one sub-pixel merely corresponds to one pixel group. Each of a top and a bottom of each row of pixel groups is provided with one gate line that only belongs to the each row of pixel groups. In each pixel group, one sub-pixel is driven by a corresponding gate line at the top of the one sub-pixel, and the other one sub-pixel is driven by a corresponding gate line at the bottom of the sub-pixel, and the two sub-pixels are connected to the same data line. The second common electrode line is provided between adjacent pixel groups.

Further, the array substrate further includes a common electrode on the base substrate; the first common electrode line directly overlaps with the common electrode.

Further, the array substrate further includes a common electrode over a data line layer, and the common electrode is connected to the second common electrode in a bridged mode.

Further, the gate line and the first common electrode line are formed from a first metal material layer, and the data line and the second common electrode line are formed from a second metal material layer.

Further, the second common electrode line is provided in a non-display region between adjacent data lines. The array substrate further includes a pixel electrode. The second common electrode line and the pixel electrode are in the same layer.

Further, the array substrate further includes a common electrode above the pixel electrode layer and a passivation layer between the common electrode and the pixel electrode, the passivation layer is provided with a via hole. The common electrode is connected to the second common electrode line in a bridged mode through the via hole in the passivation layer.

In addition, one embodiment of the present disclosure further provides a display device including the array substrate.

Besides, one embodiment of the present disclosure further provides a method for manufacturing the above array substrate, including a step of forming the gate line and the data line on the base substrate.

The method further includes forming a first common electrode line from a first material layer through a first patterning process in such a manner that an extending direction of the first common electrode line is the same as that of the gate line, and forming a second common electrode line from a second material layer through a second patterning process in such a manner that an extending direction of the second common electrode line is the same as that of the data line.

The first common electrode line and the second common electrode line are in different layers, and the first common electrode line and the second common electrode line are connected in a bridged mode.

The method further includes forming the gate line from the first material layer through the first patterning process, and forming the data line or a pixel electrode from the second material layer through the second patterning process.

The technical solution of the present disclosure has beneficial effects as follows.

In the solutions of the present disclosure, common electrode lines are respectively provided on the two conductive layers which include a gate line conductive layer and a data line conductive layer on the array substrate, and the two layers of common electrode lines are connected in a bridged mode in parallel to reduce a resistance of the common electrode lines, thereby reducing an influence of the voltage fluctuation of the common electrode signal and effectively preventing the green screen phenomenon from happening.

DETAILED DESCRIPTION

In order to make the technical problem to be solved, the technical solutions and the advantages of the present disclosure more apparent, the present disclosure will be described hereinafter in a clear and complete manner in conjunction with the drawings and embodiments.

To solve the technical problem, the present disclosure provides an array substrate with a novel structure. The array substrate is provided with common electrode lines having a small resistance value so as to reduce voltage disturbances of common electrode signals.

Figure 1:
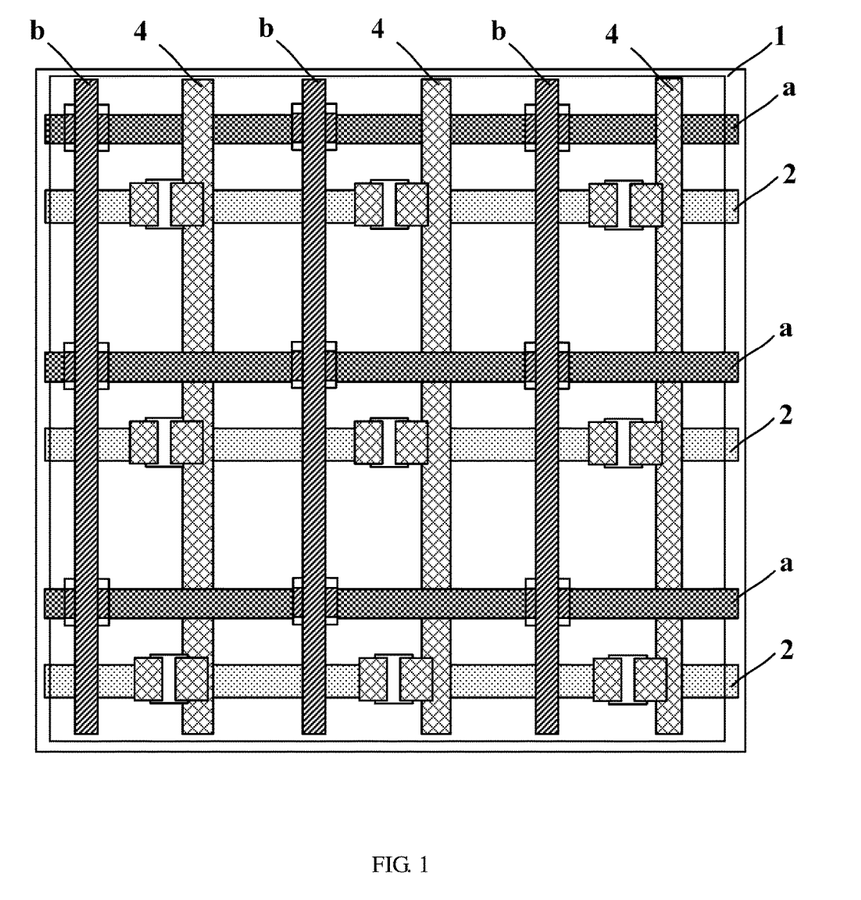
FIG. 1 is a schematic view showing a structure of an array substrate of the present disclosure.

As shown in FIG. 1, the array substrate in one embodiment includes gate lines 2, data lines 4 and common electrode lines that are formed on a base substrate 1.

The common electrode lines include two parts, i.e. first common electrode lines a which extend along a same direction as that of the gate lines 2 and which are in a same layer as the gate line 2, and second common electrode lines b which extend a same direction as that of the data lines.

The first common electrode line a and the second common electrode line b are connected in a bridged mode, i.e. other functional layers such as a gate insulation layer are formed therebetween.

In the array substrate of one embodiment, an extending direction of the first common electrode line is substantially perpendicular to an extending direction of the second common electrode line, and the first common electrode line and the second common electrode line are connected in a bridged mode. On one hand, a cross-sectional area of the entire trace may be increased; on the other hand, a parallel connection is formed between the first common electrode line and the second common electrode line. Therefore, the resistance value of the overall common electrode lines may be effectively reduced, thereby reducing the voltage fluctuation of the common electrode signal and effectively preventing the green screen phenomenon from happening.

Of course, it can be understood based on the above principle that, since the extending direction of the first common electrode line is the same as that of the gate line, thus, it becomes the most easily realized solution to form the first common electrode lines and the gate lines in the same layer, even from the same material, through one patterning process. Similarly, the second common electrode lines and the data lines may be formed in the same layer, even from the same material, through one patterning process.

However, in actual applications, if signal lines are too close, disturbances are generated. Since scanning signals are applied to the gate lines and only need to turn on corresponding thin film transistors with a fixed potential, thus, when the first common electrode line is provided between the gate lines, the scanning signals will not be disturbed by signals on the first common electrode line. Potential of the data signals on the data line is needed to be changed continually so as to change the polarity of the pixel. Thus, if the second common electrode line is excessively close to the data line, the display quality will be affected. Therefore, as an optional solution, it is needed to reasonably determine whether to provide the second common electrode lines in the data line layer according to a distance between the data lines.

Arrangements of the second common electrode lines are described hereinafter in details.

In the related art, under the premise of a fixed aperture ratio, a distance between data lines is determined by a pixel driving manner. At present, there are two pixel driving manners, i.e. "single-gate driving" and "double-gate driving".

Figure 2:
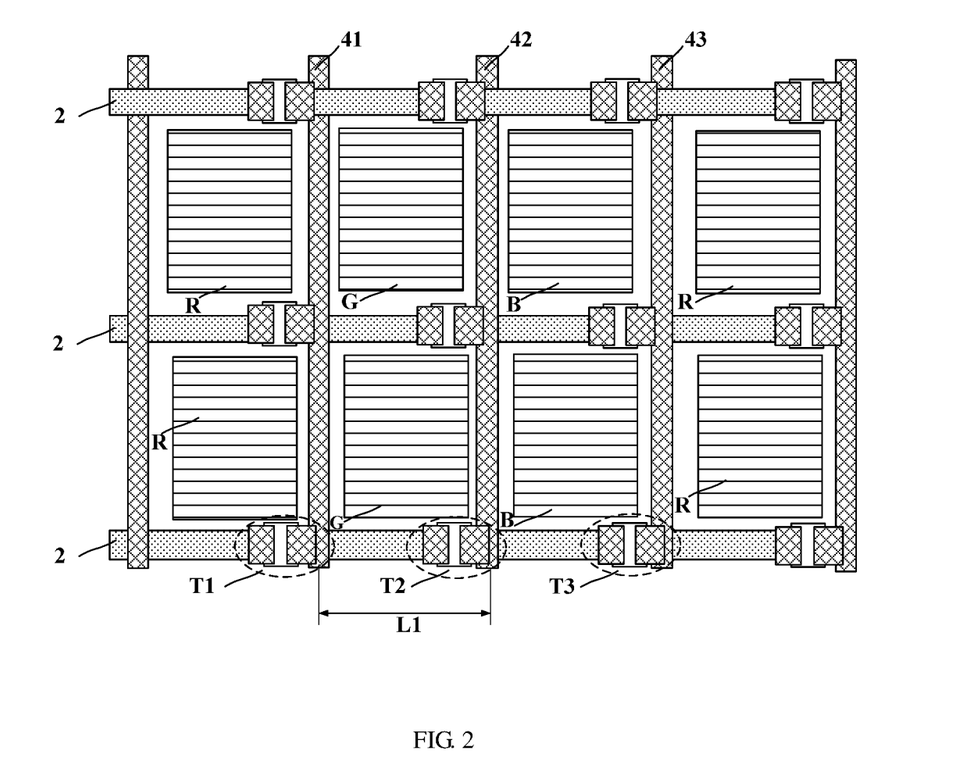
FIG. 2 is a schematic view showing a structure of an array substrate which adopts a single-gate driving manner in the related art.

The single-gate driving means that each of sub-pixels in a row direction is provided with data signals by a respective data line. As an example, as shown in FIG. 2, it is supposed that one pixel unit in the row direction includes three sub-pixels including red (R,) green (G) and blue (B) sub-pixels (a white sub-pixel is additionally added to one pixel unit of a display of 4K resolution). The sub-pixels R, G and B in the same row correspond to thin film transistors T1, T2 and T3, respectively. The thin film transistors T1, T2 and T3 are driven by the same gate line. After the thin film transistors T1, T2 and T3 are turned on by the scanning signals on the gate line, the sub-pixel R is provided with the data signal on a data line 41, the sub-pixel G is provided with the data signal on a data line 42, and the sub-pixel B is provided with the data signal on a data line 43. FIG. 2 just shows a single-gate driving structure.

Figure 3:
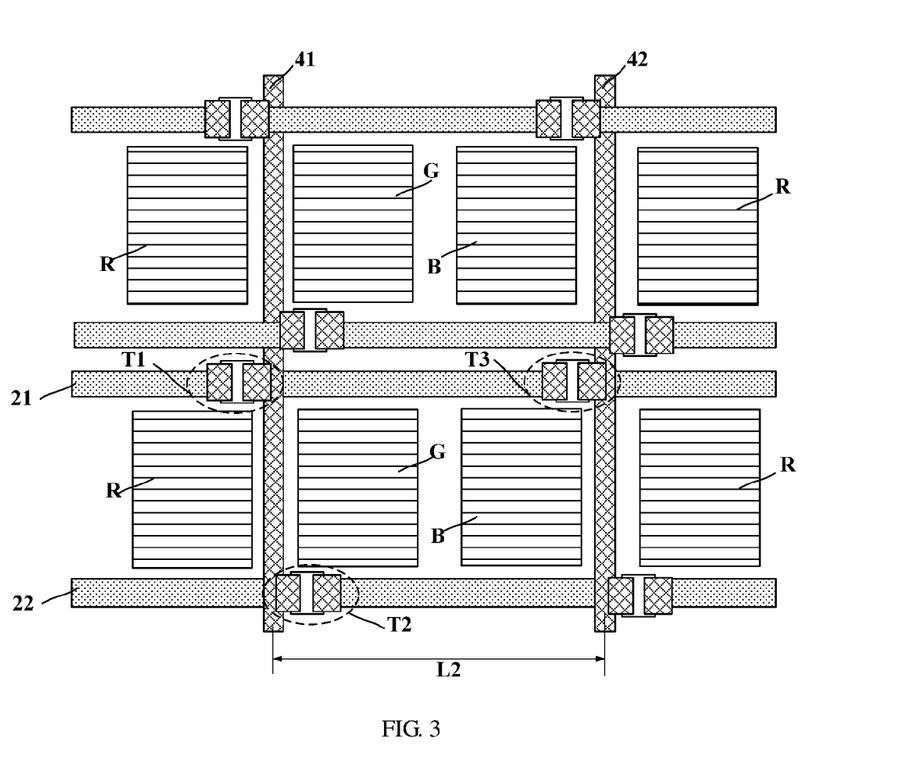
FIG. 3 is a schematic view showing a structure of an array substrate which adopts a double-gate driving manner in the related art.

For the double-gate driving, the sub-pixels may be divided into a plurality of pixel groups. Each pixel group is defined by two adjacent sub-pixels in the same row, and each sub-pixel merely corresponds to one pixel group. Each of the top and the bottom of each row of pixel groups is provided with one gate line which merely belongs to the each row of pixel groups. In each pixel group, one sub-pixel is driven by the corresponding gate line at the top of the one sub-pixel, and the other sub-pixel is driven by the corresponding gate line at the bottom of the other sub-pixel, and the two sub-pixels are connected to the same data line. As an example, as shown in FIG. 3, sub-pixels R, G and B in the same row correspond to thin film transistors T1, T2 and T3, respectively. The thin film transistors T1 and T3 are driven by the gate line 21. After the thin film transistors T1 and T3 are turned on by the gate line 21, the sub-pixels R and G are provided the data signal on the data line 41. While the thin film transistor T2 is driven by the gate line 22. After the gate line 22 turns on the thin film transistor T2, the sub-pixel B is provided with the data signal on the data line 42.

Comparing FIG. 2 with FIG. 3, a distance L2 between two data lines in FIG. 3 is far greater than a distance L1 between two data lines in FIG. 2. That is, in the double-gate driving structure, the second common electrode line and the data line are provided in the same layer, and they are away from each other by a greater distance and thus and the phenomenon of mutual signal disturbance can be effectively inhibited. In the single-gate driving structure, since data lines are away from each other by a small distance, the second common electrode line may be provided in other conductive layers such as a pattern layer of a pixel electrode so as to avoid affecting the display quality.

The array substrate of the present disclosure is described hereinafter in details in conjunction with several implementation manners.

Figure 4:
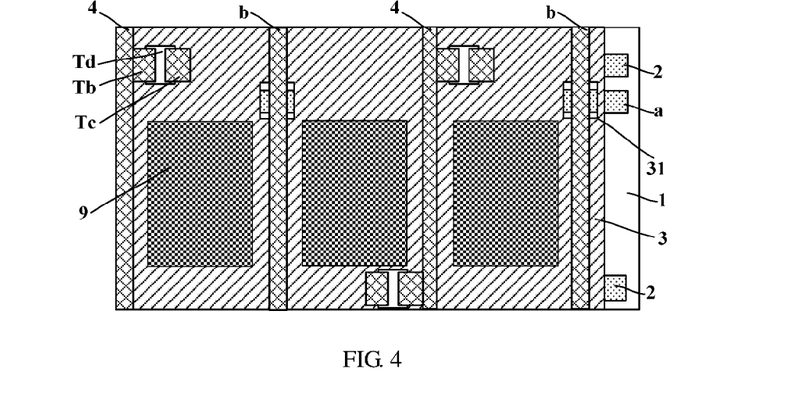
FIG. 4 is a schematic view showing a structure of an array substrate according to at least some embodiments of the present disclosure.
Figure 5:
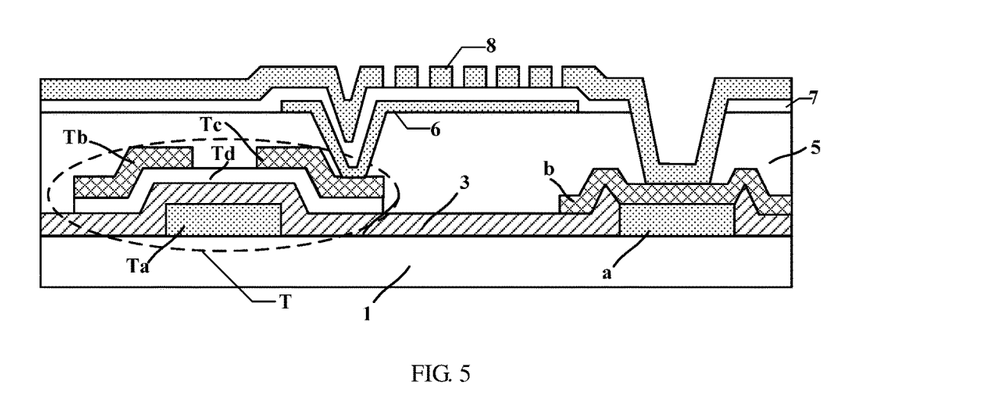
FIG. 5 is a cross-sectional view of the array substrate in FIG. 4.

The array substrate in at least some embodiments of the present disclosure has a double-gate driving structure, and the second common electrode lines are formed in a data line layer. As shown in FIGS. 4 and 5, the array substrate includes:

a base substrate 1;

a thin film transistor T formed on the base substrate 1, where the thin film transistor T is formed by a gate electrode Ta, a source electrode Tb, a drain electrode Tc and an active layer Td, and the gate electrode Ta is covered with a gate insulation layer 3.

A gate line 2 extends to a position of the gate electrode Ta. A first common electrode line a is made of the same material as that of the gate line and is in the same layer as the gate line is in.

A data line 4 extends to a position of the source electrode Tb. A second common electrode line b is made of the same material as the data line and is in the same layer as the data line is in. The second common electrode line b and the first common electrode a are connected in a bridged mode by means of a via hole 31 in the gate insulation layer 3. The via hole 31 in the gate insulation layer is at a region where the first common electrode line overlaps with the second common electrode line. If the data line 4 and the second common electrode line b are made of metal materials having lower resistances, the second common electrode line b may be at a non-display region between pixel regions 9 (i.e. between the pixel groups mentioned above) so as to avoid shielding a light source below.

An overcoat layer 5 is formed above the second common electrode line b and the data line. A pixel electrode 6 is provided on the overcoat layer 5. The pixel electrode 6 is connected to the drain source Tc through a via hole in the overcoat layer 5.

A passivation layer 7 is formed on the pixel electrode 6. A common electrode 8 is formed on the passivation layer 7. The common electrode 8 is connected to the second common electrode line b through via holes in the passivation layer 7 and the overcoat layer 5. That is, the common electrode and the second common electrode line are connected in a bridged mode. The common electrode 8 is in a slit shape, and the pixel electrode 6 is in a plate shape.

It should be noted that, the array substrate in at least some embodiments of the present disclosure has a double-gate driving structure, but the second common electrode line b and the pixel electrode 6 may be provided in the same layer. When the second common electrode line b and the pixel electrode 6 are provided in the same layer, the common electrode 8 formed above the pixel electrode 6 is connected with the second common electrode line b in a bridged mode through the via hole in the passivation layer 7. In the related art, the pixel electrode is in a display region, and thus, it is made of a transparent conductive ITO material. The data lines in a non-display region may be made of non-transparent metal materials having better conductive property (such as copper, aluminum, molybdenum/aluminum/molybdenum). Therefore, for the array substrate of the double-gate driving structure, when the second common electrode line is provided in the data line layer, the resistance reduction effect is obviously better than that generated when the common electrode line is provided on the pixel electrode layer.

The above relates to the structure of the array substrate in at least some embodiments of the present disclosure. In the double-gate driving manner, the data lines are away from each other by a greater distance, and thus the second common electrode line is provided between the data lines. As can be seen, the gate line layer and the data line layer are two relatively close conductive layers in the entire array substrate. Although one part of the common electrode line at the via hole has a relatively small cross section but has a relatively short length, so the resistance of the entire common electrode line is not too large.

Figure 6:
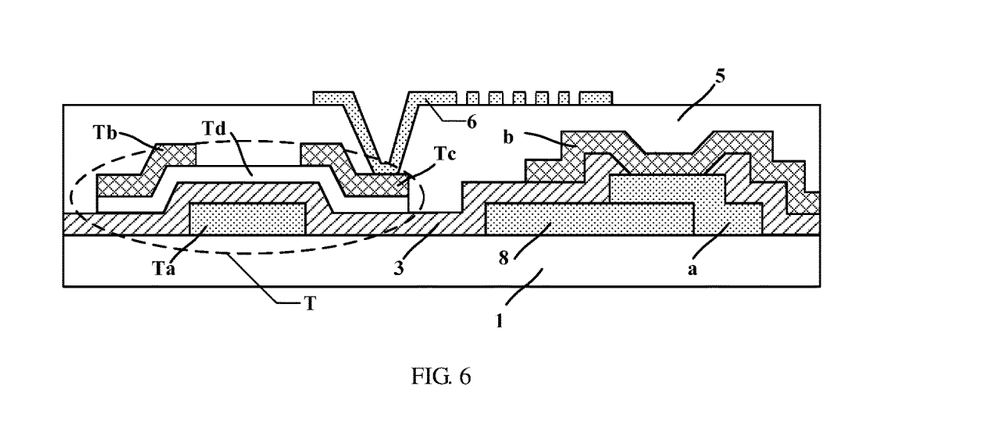
FIG. 6 is a schematic view showing a structure of an array substrate according to at least some embodiments of the present disclosure.

The array substrate shown in FIG. 6 also uses the double-gate driving structure, and the second common electrode line b and the data line are formed in the same layer.

The structure in FIG. 6 differs from the structure shown in FIG. 5 in that the common electrode 8 is formed between the gate line layer and the base substrate 1. At least one part of the first common electrode line a that is in the same layer as the gate line is in, is directly formed on the common electrode 8. That is, the first common electrode line a and the common electrode 8 are overlapped with each other. Meanwhile, the first common electrode line a and the second common electrode line b are connected in a bridged mode through the via hole in the gate insulation layer 3. The common electrode 8 is in a plate shape, and the pixel electrode 6 is in a slit shape.

Comparing FIG. 5 with FIG. 6, the array substrate in FIG. 6 is more simplified compared with the array substrate in FIG. 5. Therefore, the array substrate in FIG. 6 has a distinct advantage in the manufacturing costs and the manufacturing efficiency.

Figure 7:
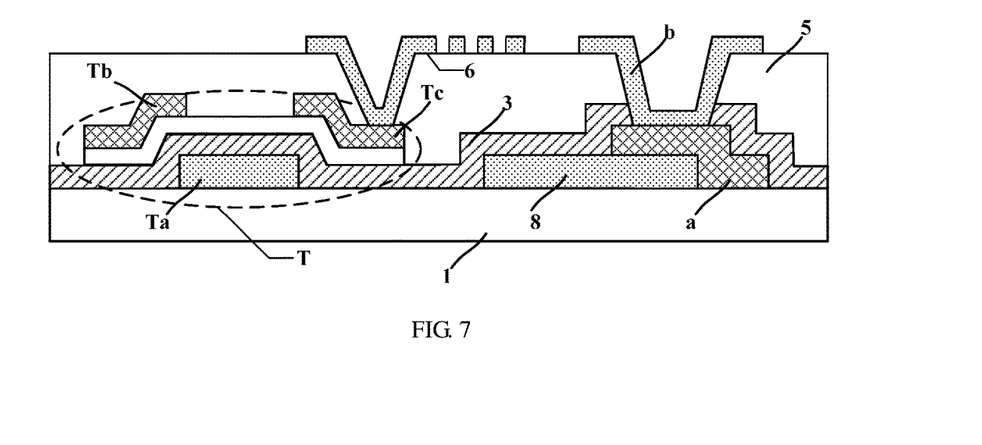
FIG. 7 is a schematic view showing a structure of an array substrate according to at least some embodiments of the present disclosure.

The array substrate in at least some embodiments of the present disclosure has a single-gate driving structure. Referring to the above disclosure, the data lines of the single-gate driving structure are away from each other by a relatively short distance. Therefore, the second common electrode b is not provided in the data line layer so as to ensure the display quality.

As shown in FIG. 7, the common electrode 8 of the array substrate in at least some embodiments of the present disclosure is still formed between the gate line layer and the base substrate 1.

The structure in FIG. 7 differs from the structure shown in FIG. 6 in that the second common electrode line b and the pixel layer 6 are made of the same material and are in the same layer, and the second common electrode line b is connected to the first common electrode line a in a bridged mode through the via holes in the overcoat layer 5 and the gate insulation layer 3.

In the structure of the array substrate shown in FIG. 7, the data lines are close to each other in a single-gate driving manner. Therefore, the common electrode line b is provided in the pixel electrode layer so as to avoid the occurrence of the phenomenon of signal interference.

Based on the above several implementation manners of the array substrate, it should be noted that, since the positions of the common electrode and the pixel electrode are not unique, there are several manners of connecting the first and second common electrode lines. However, these connecting manners are not limited to the scope of the present disclosure.

In addition, one embodiment of the present disclosure further provides a display device including the above array substrate. Since the resistance of the common electrode line of the array substrate is reduced, thus, compared with the related art, there is no need to occupy an outer space of the array substrate for disposing the common electrode line, which is particularly suitable for a display device which requires setting drivers at two sides of the array substrate.

Besides, one embodiment of the present disclosure further provides a method for manufacturing an array substrate. The method includes a step of forming a gate line and a data line on a base substrate.

What is different from the related art is that in this embodiment, a first common electrode line is obtained from a first material layer through a first patterning process and an extending direction of the first common electrode line is the same as that of the gate line. In addition, a second common electrode line is obtained from a second material layer through a second patterning process, and an extending direction of the second common electrode line is the same as that of the data line. The first common electrode line and the second common electrode line are provided in different layers, and the first common electrode line and the second common electrode line are connected in a bridged mode.

In the method according to at least some embodiments of the present disclosure, the first common electrode line is connected to the second common electrode line whose extending direction is approximately perpendicular to the extending direction of the first common electrode line, in a manner of spanning over a layer with a parallel connection relation formed between the first common electrode line and the second common electrode line as well as an increased cross-sectional area of overall common electrode lines. As a result, the resistance of the common electrode line is reduced, and then the voltage fluctuation generated when signals are applied to the common electrode line is inhibited.

Of course, as an optional solution, the gate line is also formed from the first material layer through the first patterning process. That is, the gate line and the first common electrode line are made of the same material and are formed in the same layer. The data line or the pixel electrode is also formed from the second material layer through the second patterning process. That is, the second common electrode line and the data line or the pixel electrode are made of the same material and are formed in the same layer.

The method in at least some embodiments of the present disclosure is described hereinafter in conjunction with the structure of the array substrate shown in FIG. 6.

The method of this embodiment includes following steps.

Figure 8A:
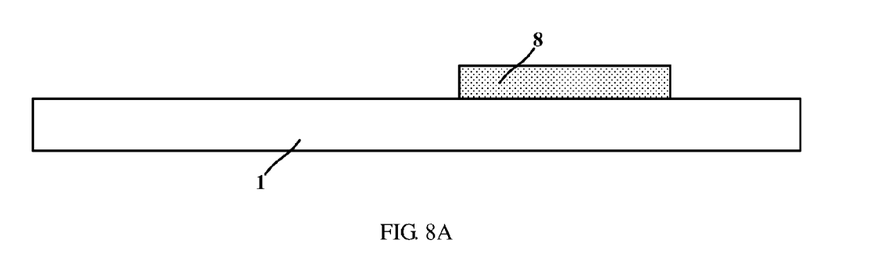
FIGS. 8A-8F are flow charts of a method for manufacturing the array substrate shown in FIG. 6.

At Step S801, referring to FIG. 8A, a common electrode 8 is formed on a base substrate 1 from ITO material layer.

Figure 8B:
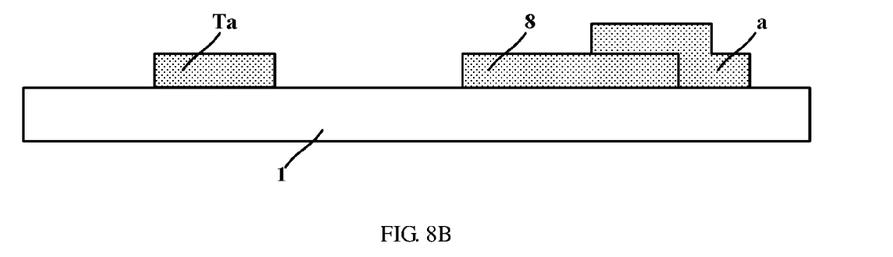

At Step S802, referring to FIG. 8B, a gate electrode Ta, a gate line (not shown) and a first common electrode a are formed on the base substrate with the common electrode 8 through a patterning process from a metal layer.

Figure 8C:
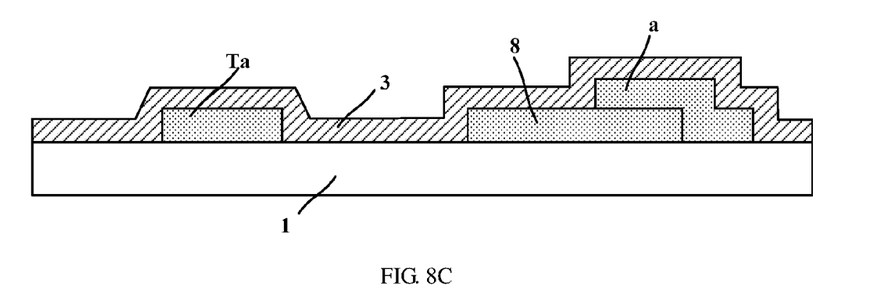

At Step S803, referring to FIG. 8C, a gate insulation layer 3 is formed on the base substrate 1 in such a manner that the gate insulation layer 3 covers the gate electrode Ta, the gate line (not shown) and the first common electrode a.

Figure 8D:
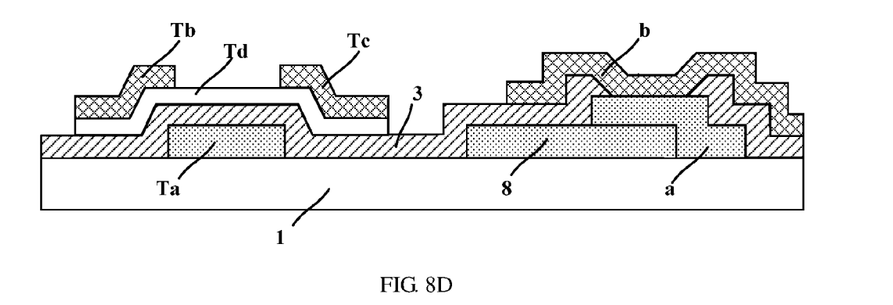

At Step S804, referring to FIG. 8D, a via hole is formed in the gate insulation layer 3, and an active layer Tb, a source electrode Td, a drain electrode Tc and a second common electrode b are formed through one patterning process.

The second common electrode line b, the source electrode Tb and the drain electrode Tc may be from of the same metal material layer, and the second common electrode line b is connected to the first common electrode line a in a bridged mode through the via hole in the gate insulation layer 3.

Figure 8E:
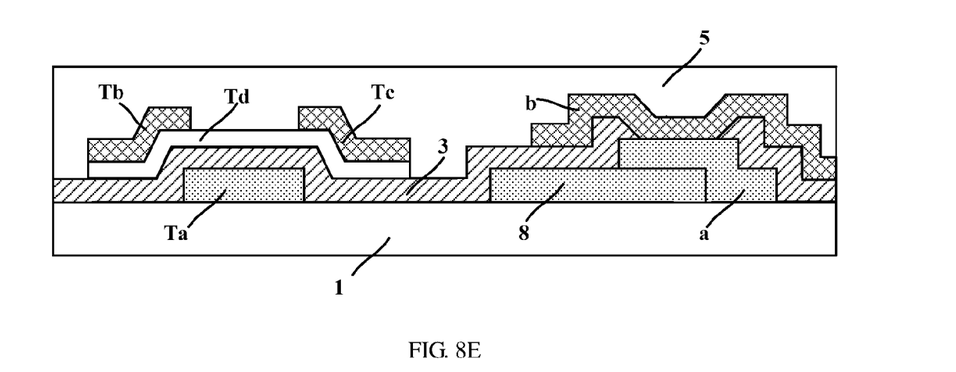

At Step S805, referring to FIG. 8E, an overcoat layer 5 is formed in such a manner that the overcoat layer 5 covers the second common electrode line b, the source electrode Tb and the drain electrode Tc.

Figure 8F:
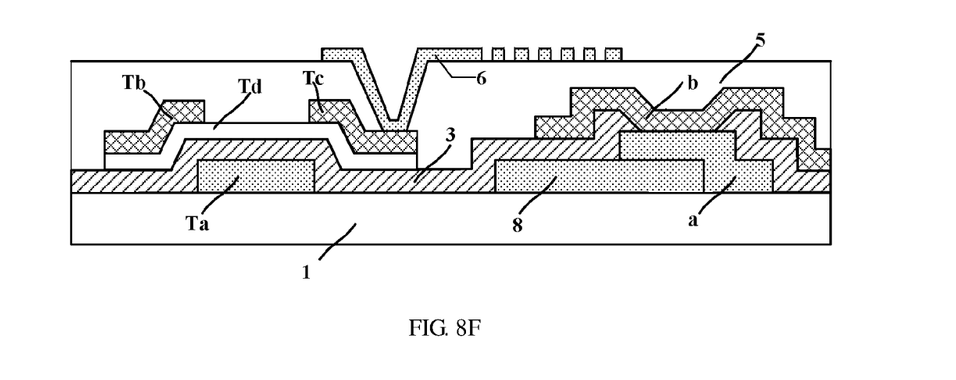

At Step S806, referring to FIG. 8F, a via hole is formed in the overcoat layer 5, and a pixel electrode 6 is formed on the overcoat layer in such a manner that the pixel electrode 6 is connected to the drain electrode Tc through the via hole in the overcoat layer 5.

The above method is to manufacture the array substrate shown in FIG. 6. It should be noted that, the method of the present disclosure may also be used to manufacture the array substrate shown in FIG. 7, and then the second common electrode line is formed in a patterning process of the pixel electrode. That is, the second common electrode line and the pixel electrode are made of the same material through one patterning process.

The above embodiments are merely the optional embodiments. It should be pointed out that a person skilled in the art may easily make further variations and substitutions without departing from the principle of the present disclosure, and these variations and substitutions shall also be included in the scope of the present invention.

What is claimed is:

1. An array substrate, comprising: a base substrate, and a plurality of gate lines and data lines on the base substrate; wherein the array substrate further comprises:
   a first common electrode line with an extending direction that is the same as that of the gate lines;
   a second common electrode line with an extending direction that is the same as that of the data lines; and
   a gate insulation layer between the gate lines and the data lines;
   wherein the first common electrode line and the second common electrode line are in different layers, the gate lines and the first common electrode line are in the same layer, the second common electrode line and the data lines are in the same layer, the gate insulation layer comprises a via hole, and the first common electrode line and the second common electrode line are connected in a bridged mode through the via hole in the gate insulation layer.

2. The array substrate according to claim 1, wherein the via hole in the gate insulation layer is at a region where the first common electrode line overlaps with the second common electrode line.

3. The array substrate according to claim 1, further comprising sub-pixels in rows and columns;
   wherein the sub-pixels in rows and columns are divided into a plurality of pixel groups, each of the pixel groups is defined by two adjacent sub-pixels in the same row, and each sub-pixel corresponds to only one pixel group, wherein each of a top and a bottom of each row of pixel groups is provided with one gate line which only belongs to the each row of pixel groups;

wherein in each pixel group, one sub-pixel is driven by the corresponding gate line at the top of the one sub-pixel, the other one sub-pixel is driven by the corresponding gate line at the bottom of the other one sub-pixel, and the two sub-pixels are connected to the same data line; and wherein the second common electrode line is between adjacent pixel groups.

4. The array substrate according to claim 1, further comprising a common electrode on the base substrate; wherein the first common electrode line directly overlaps with the common electrode.

5. The array substrate according to claim 1, further comprising a common electrode over a data line layer; wherein the common electrode is connected to the second common electrode in a bridged mode.

6. The array substrate according to claim 3, wherein the gate lines and the first common electrode line are formed from a first metal material layer, and the data lines and the second common electrode line are formed from a second metal material layer; and the second common electrode line is within a non-display region between adjacent data lines.

7. The array substrate according to claim 1, further comprising a pixel electrode;

wherein the second common electrode line and the pixel electrode are in the same layer.

8. The array substrate according to claim 7, further comprising:

a common electrode above the pixel electrode; and a passivation layer between the common electrode and the pixel electrode;

wherein the passivation layer comprises a via hole, and the common electrode and the second common electrode line are connected in a bridged mode through the via hole in the passivation layer.

9. A display device, comprising: the array substrate according to claim 1.

10. A method for manufacturing an array substrate, comprising a step of forming a gate line and a data line on a base substrate, wherein the method further comprises:

forming a first common electrode line from a first material layer through a first patterning process in such a manner that an extending direction of the first common electrode line is the same as that of the gate line; and forming a second common electrode line from a second material layer through a second patterning process in such a manner that an extending direction of the second common electrode line is the same as that of the data line;

wherein the first common electrode line and the second common electrode line are in different layers, the gate lines and the first common electrode line are in the same layer, the second common electrode line and the data lines are in the same layer, the array substrate further comprises a gate insulation layer between the gate lines and the data lines, and the gate insulation layer comprises a via hole, and the first common electrode line and the second common electrode line are connected in a bridged mode through the via hole in the gate insulation layer.

11. The method according to claim 10, further comprising forming the gate line from the first material layer through the first patterning process, and forming the data line or a pixel electrode from the second material layer through the second patterning process.

12. The display device according to claim 9, wherein the via hole in the gate insulation layer is at a region where the first common electrode line overlaps with the second common electrode line.

13. The display device according to claim 9, wherein the array substrate further comprises sub-pixels in rows and columns;

wherein the sub-pixels in rows and columns are divided into a plurality of pixel groups, each of the pixel groups is defined by two adjacent sub-pixels in the same row, and each sub-pixel corresponds to only one pixel group, wherein each of a top and a bottom of each row of pixel groups is provided with one gate line which only belongs to the each row of pixel groups;

wherein in each pixel group, one sub-pixel is driven by the corresponding gate line at the top of the one sub-pixel, the other one sub-pixel is driven by the corresponding gate line at the bottom of the other one sub-pixel, and the two sub-pixels are connected to the same data line; and wherein the second common electrode line is between adjacent pixel groups.

14. The display device according to claim 9, wherein the array substrate further comprises a common electrode on the base substrate; wherein the first common electrode line directly overlaps with the common electrode.

15. The display device according to claim 9, wherein the array substrate further comprises a common electrode over a data line layer; wherein the common electrode is connected to the second common electrode in a bridged mode.

16. The display device according to claim 13, wherein the gate lines and the first common electrode line are formed from a first metal material layer, and the data lines and the second common electrode line are formed from a second metal material layer; and the second common electrode line is within a non-display region between adjacent data lines.

17. An array substrate, comprising: a base substrate, and a plurality of gate lines and data lines on the base substrate; wherein the array substrate further comprises:

a first common electrode line with an extending direction that is the same as that of the gate lines;

a second common electrode line with an extending direction that is the same as that of the data lines;

a pixel electrode;

a common electrode above the pixel electrode; and a passivation layer between the common electrode and the pixel electrode;

wherein the first common electrode line and the second common electrode line are in different layers, the gate lines and the first common electrode line are in the same layer, the second common electrode line and the pixel electrode are in the same layer, and the first common electrode line and the second common electrode line are connected in a bridged mode; and the passivation layer comprises a via hole, and the common electrode and the second common electrode line are connected in a bridged mode through the via hole in the passivation layer.

* * * * *